(12) United States Patent
Martin (10) Patent No.: US 9,026,390 B2
(45) Date of Patent: May 5, 2015

(54) INTERLEAVED RF TRIGGERING ON A TEST AND MEASUREMENT INSTRUMENT

(75) Inventor: Gregory A. Martin, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 911 days.

(21) Appl. No.: 13/226,336

(22) Filed: Sep. 6, 2011

(65) Prior Publication Data

US 2013/0060527 A1 Mar. 7, 2013

(51) Int. Cl.
*G01R 13/00* (2006.01)
*G01R 13/32* (2006.01)
*G01R 13/02* (2006.01)

(52) U.S. Cl.
CPC .................... *G01R 13/0254* (2013.01)

(58) Field of Classification Search
CPC .... G01R 13/245; G01R 23/16; G01R 23/167; G01R 29/02; G01R 23/163; G01R 23/165; H04B 1/16
USPC .............................. 702/66, 76, 124, 189, 190
See application file for complete search history.

(56) References Cited

U.S. PATENT DOCUMENTS

| | | | | |
|---|---|---|---|---|
| 4,802,098 A | * | 1/1989 | Hansen et al. | 702/67 |
| 6,615,148 B2 | * | 9/2003 | Pickerd | 702/66 |
| 2008/0082278 A1 | * | 4/2008 | Tan et al. | 702/76 |
| 2010/0204939 A1 | * | 8/2010 | Hillman et al. | 702/76 |

OTHER PUBLICATIONS

Lyons, Quadrature Signals, Complex, But Not Complicated, Nov. 2008, p. 1; www.ieee.i/pdf/essay/quadrature_signals.pdf.*

* cited by examiner

*Primary Examiner* — Janet Suglo
*Assistant Examiner* — L. Anderson
(74) *Attorney, Agent, or Firm* — Marger Johnson & McCollom, PC

(57) ABSTRACT

A time-interleaved RF triggering method and system on a test and measurement instrument includes an acquisition component that samples a waveform, which is converted into an amplitude, phase, frequency, in-phase (I), and quadrature (Q) waveform, any of which can be used for triggering an RF digital trigger, including triggering that uses demodulation and/or decoding of the down-converted complex IQ data samples for a given protocol. Aliasing caused by subsampled data in each of the interleaved acquisition components is cancelled out using a fractional time-shift filter.

25 Claims, 4 Drawing Sheets

INTERLEAVED RF TRIGGERING ON A TEST AND MEASUREMENT INSTRUMENT

BACKGROUND

This disclosure relates to test and measurement devices, and in particular, to a distributed time-interleaved acquisition RF triggering method and system.

Traditionally, test and measurement instruments such as spectrum analyzers and vector analyzers have had minimal triggering capabilities. Mixed-Domain Oscilloscopes (MDOs) represent a new product category of test and measurement devices, which integrate many of the spectral acquisition, triggering, and display capabilities of Real-Time Spectrum Analyzer (RTSA) products with the functionality of traditional oscilloscope products. In addition to supporting time domain features of traditional oscilloscopes and frequency domain features of RTSAs, the MDO products enable cross-correlation between both domains for acquisition, triggering, display, and analysis functions.

In such newer types of products, the RF input signal is digitally down-converted to produce I (in-phase) and Q (quadrature) baseband component information from the RF signal. More specifically, the RF signal is numerically multiplied with sine and cosine components of a numerically controlled oscillator (NCO), thereby generating the demodulated baseband I and Q component information, which contains all of the information present in the original RF signal. The trigger system can then trigger on criteria associated with the IQ baseband component information.

Figure 1:
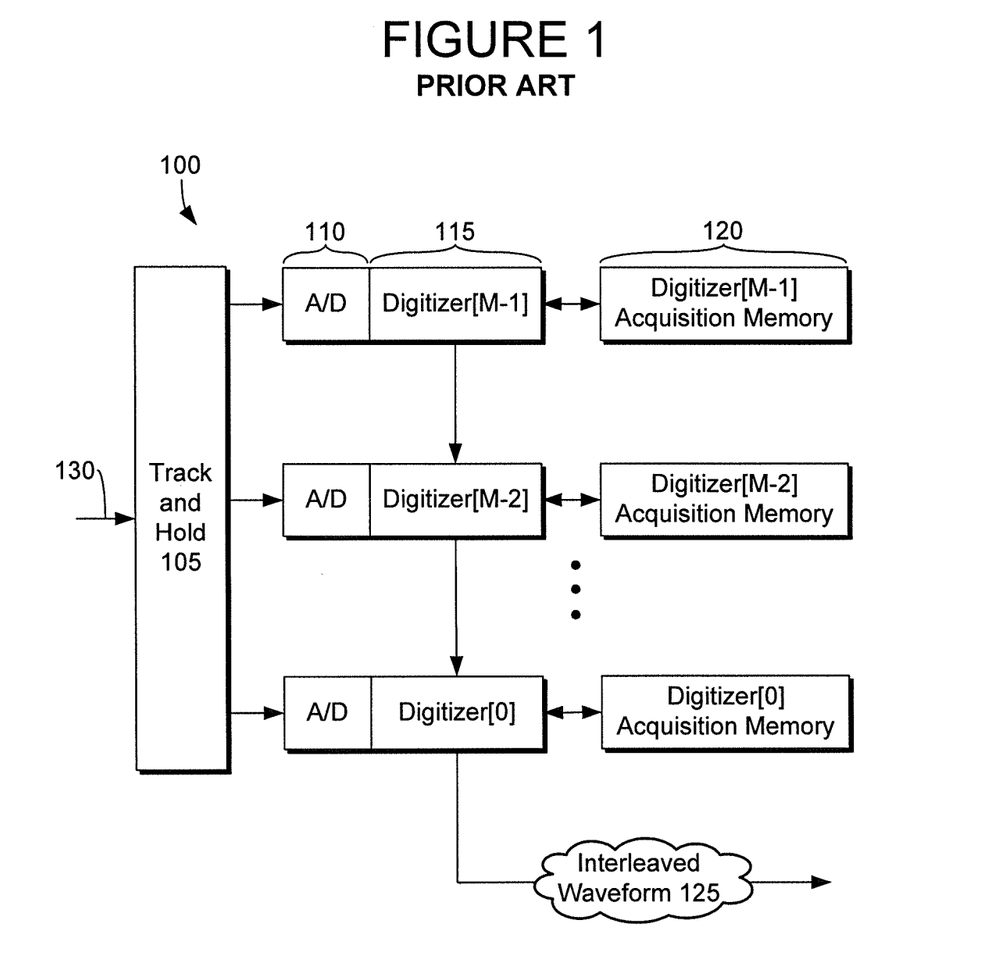
FIG. 1 illustrates a conventional time-interleaved acquisition system used in an oscilloscope.

In conventional oscilloscopes, time-interleaved acquisition is an approach for building test and measurement device acquisition systems with scalable sample rate and bandwidth, and to extend acquisition systems beyond the capabilities of individual analog to digital converter (ADC) and/or digitizer components. For example, FIG. 1 shows a conventional example of a time-interleaved acquisition system 100 used in oscilloscopes. A high-bandwidth sampler such as a track and hold component 105 is used to distribute sampled versions of the input signal 130 to multiple ADCs 110 with appropriate offsets in sampling time, based on the aggregate sample rate of the acquisition system.

A digitizer component such as component 115 is then used to process the incoming samples and store them in acquisition memory 120. The digitizer component 115 is a type of building block for acquisition, triggering, display, and analysis in an oscilloscope device. There is usually some form of interconnect between the different digitizer components for further processing of time-interleaved data samples, which results in a coherent waveform 125 at the full sample rate of the acquisition system.

Prior approaches to supporting mixed-domain and RF triggering functionality primarily target single-digitizer component systems, which limits the sample rate and bandwidth that can be acquired. To support a greater input frequency range in an acquisition system traditionally has required expensive RF oscillator and mixer components to down-convert the input signal in the analog domain prior to the ADC component. This type of system is still limited to the bandwidth and sample rate of a single ADC.

It would be desirable to have an acquisition technique that allows the acquisition to span wide bandwidths that exceed the bandwidth and sample rate supported by a single ADC component and allow real-time RF triggering on any frequency range within the wide bandwidth of the system in an efficient manner. It would also be desirable to distribute the digital down-conversion (DDC) function and related computations between multiple distributed time-interleaved acquisition components and reconstruct a coherent waveform in real-time to support RF trigger functionality.

DETAILED DESCRIPTION

Embodiments of the invention disclosed herein provide an approach for supporting RF triggering in a time-interleaved acquisition system to support real-time RF trigger functionality over a wide frequency range. RF triggering refers to trigger modes which use complex down-converted data, such as amplitude (i.e., power), phase, and frequency based trigger modes, as well as triggering on I (in-phase) and Q (quadrature) waveforms directly. RF triggering also refers to any trigger modes that demodulate and decode the down-converted data to any given RF protocol to use as trigger conditions. When tuning an RF trigger to a given frequency span of interest (i.e., a subset of the total acquired bandwidth range), embodiments of the present invention reduce the communication bandwidth between distributed acquisition components and support more efficient processing of the input signal.

The concepts and embodiments disclosed herein can be implemented within a variety of test and measurement instruments such as a spectrum analyzer, an oscilloscope, a vector analyzer, a mixed-domain oscilloscope (MDO), or any other suitable test and measurement device. In a preferred embodiment, a test and measurement instrument includes mixed-domain functionality such as the capability of processing and/or triggering on signal data in both the time domain and the frequency domain. Some of the key attributes of mixed-domain architectures include the following:

Digital-down conversion of input channels (e.g., analog and/or RF inputs), which allows data compression into acquisition memory for spectral data within a given frequency range of interest (i.e., any span within the aggregate bandwidth of the system). With a fixed size acquisition memory, this enables acquisitions over a longer time span, enabling a lower spectral resolution bandwidth.

Triggering on down-converted spectral waveforms, including RF triggers for power, frequency, phase, and the down-converted (i.e., demodulated) in-phase (I) and quadrature (Q) RF vector components, as well as any trigger modes that demodulate and decode the down-converted data to any given RF protocol.

Time-domain waveform display and analysis functions on the down-converted (i.e., demodulated) input waveform (i.e., with vector converted waveforms similar to the RF trigger waveforms described above).

Figure 2:
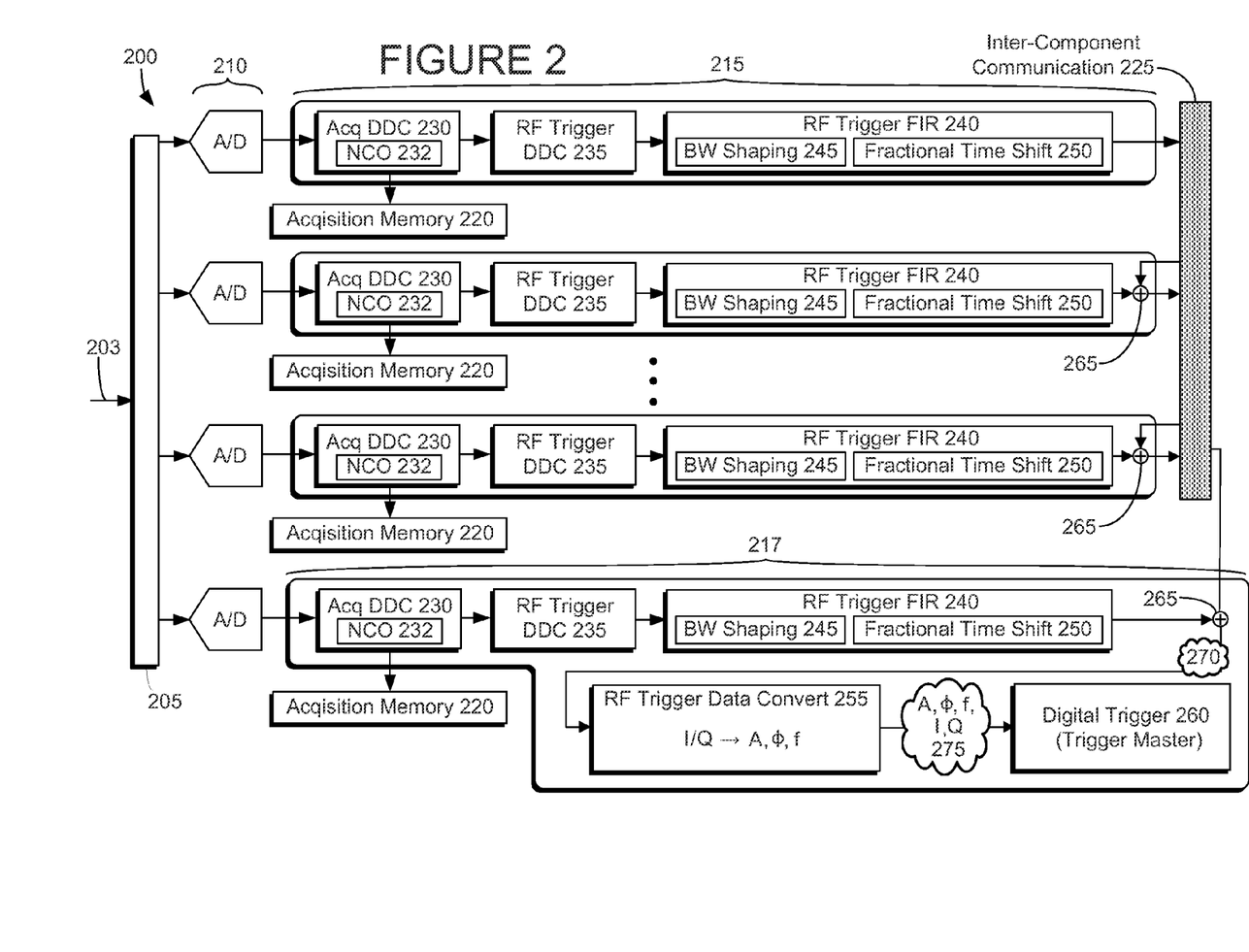
FIG. 2 illustrates a flow diagram including various components of a time-interleaved RF trigger acquisition system according to an example embodiment of the present invention.

FIG. 2 illustrates a flow diagram 200 including various components of a time-interleaved RF trigger acquisition system according to an example embodiment of the present invention. A high-bandwidth sampler such as a track and hold component 205 is used to receive an input signal or signal under test 203 and distribute sampled portions of the signal 203 to multiple ADCs 210 with appropriate offsets in sampling time, based on the aggregate sample rate of the acquisition system. It will be understood that the high-bandwidth sampler can comprise any suitable component that distributes sample data in a time-interleaved fashion, for example, to multiple ADCs. Each ADC 210 is connected to a distributed acquisition component such as 215 or 217. The ADCs 210 are configured to produce digitized samples of the signal under test. Each distributed acquisition component includes an acquisition digital down-converter section 230 (i.e., acquisition DDC section 230) for further processing, sample rate reduction, and refinement of the sampled portions of the input signal.

The acquisition DDC section 230 in each distributed acquisition component includes an interleaved numerically-controlled oscillator (NCO) 232 at the front-end to shift the desired and/or selected center frequency of the acquired span of interest to DC. The NCO waveform in each distributed acquisition component can be defined by:

$$s[n] = e^{-j\frac{2\pi f_c}{f_s}[n+\frac{m}{M}]} = \cos\left(\frac{2\pi f_c}{f_s}\left[n + \frac{m}{M}\right]\right) - j \cdot \sin\left(\frac{2\pi f_c}{f_s}\left[n + \frac{m}{M}\right]\right),$$

where $f_c$ is the desired and/or selected center frequency of the acquisition span of interest, $f_s$ is the effective aggregate sample rate of the acquisition system, n is the integer sample index in time for a given distributed acquisition component, m is the relative "phase" (i.e., from 0 to M−1) of a given distributed acquisition component in the relative interleaved sample timing order, M is the total number of distributed acquisition components in the interleaved acquisition system (i.e., interleaved chain of distributed acquisition components), and j is the imaginary unit to signify a complex number notation. The NCO waveform is defined by a complex waveform having mathematical real and imaginary parts.

Each acquisition DDC section 230 reduces the bandwidth span and sample rate through a series of low-pass filters and decimation stages (not shown). The DDC section 230 produces complex IQ data samples based on the digitized samples received from the ADCs 210. The RF trigger path (e.g., including 235 and/or 240) can tap data off the acquisition DDC section 230 once the input signal is sufficiently decimated to a sample rate that yields a feasible implementation for a given application. There is a tradeoff between where the RF data path is tapped from the acquisition DDC section (i.e., in terms of the maximum sample rate for a given stage in the acquisition DDC section) and the maximum supported RF trigger bandwidth span.

The acquisition DDC section 230 can also independently tap off data, which can be stored in acquisition memory 220. The acquisition memory 220 can be a volatile or non-volatile memory such as a RAM, flash memory, or any other suitable storage device. The data stored in the acquisition memory 220 need not have a bandwidth span and center frequency that is the same as the bandwidth span and center frequency feeding the RF trigger data path. For example, the data stored in the acquisition memory 220 can have a bandwidth span that is greater or less than the bandwidth span feeding the RF trigger data path.

Each distributed acquisition component can include a second DDC section such as the RF trigger DDC section 235 to provide further reduction in trigger bandwidth and the underlying sample rate. The DDC section 235 also can shift the center frequency used for the RF trigger 260 if desired.

After the RF trigger DDC stage, a filter such as a finite impulse response (FIR) filter 240 provides a bandwidth shaping section 245 for the RF trigger 260. Moreover, a fractional time-shift filter 250, such as a multiple distributed polyphase FIR implementation, can be combined with the bandwidth shaping section 245 in the RF trigger data path by effectively convolving these two filter responses together. In other words, the RF trigger FIR filter 240 can include the bandwidth shaping section 245 and the fractional time-shift filter 250, thereby comprising a single composite filter section disposed along each RF trigger data path. The fractional time-shift filter 250 has the following ideal frequency response (expressed as a z-transform):

$$T'_k(z) = z^{-\frac{m}{L}}$$

$$m \in [0:M-1],$$

where m is the relative "phase" (i.e., from 0 to M−1) of a given distributed acquisition component in the relative interleaved sample timing order, M is the total number of distributed acquisition components in the interleaved acquisition system, and L is the inherent down-sample factor (i.e., aggregate combination of the total down-sampling present in the acquisition DDC 230 and RF trigger DDC 235 stages) as a desired and/or selected sample rate reduction factor for a given bandwidth span relative to the aggregate input sample rate of the interleaved acquisition system. It will be understood that while the ideal frequency response of the time-shift filter 250 set forth above represents a preferred embodiment of the invention, an approximation of the ideal filter response can be used.

The fractional time-shift filters 250 perform a time alignment function on the interleaved down-converted data samples from each of the distributed acquisition component phases in the interleaved acquisition system prior to the samples being combined and properly reconstructed as a single coherent acquired waveform. Decimation of the data samples can be performed simultaneously and in parallel in the acquisition DDC 230 section and RF trigger DDC 235 section along each distributed acquisition path before being recombined. The fractional time-shift filters 250 ensures that any and/or all aliasing caused by subsampled data in each of the interleaved acquisition components is cancelled out when the partial waveforms in each distributed acquisition component are summed together, leaving only the true components of the original spectrum.

The filtered down-converted RF trigger data samples from each distributed acquisition component in the interleaved acquisition system 200 are recombined by de-interleaving and summing the partial terms together using summers 265 and inter-component communication section 225. In other words, the data samples are de-interleaved and summed across all distributed acquisition components (e.g., 215 and 217) in the interleaved acquisition system in real-time. Complex IQ data samples are exchanged between the distributed acquisition components using the inter-component communication section 225, although the inter-component communication section 225 need not ship the data samples between distributed acquisition components at the full sample rate of the system. Rather, data is exchanged between the distributed acquisition components at the final decimated sample rate of the data used for RF triggering. It will be understood that the inter-component communication section 225 can be comprised of a ring network, star network, switched fabric, or any other suitable inter-component network mechanism.

After the summation, the last distributed acquisition component 217 in the interleave chain has coherent acquisition data 270, comprising of down-converted complex IQ data samples, which are transmitted to an RF trigger data convert section 255. The RF trigger data convert section 255 can convert the complex IQ data samples to amplitude/power, phase, frequency, I, and/or Q RF trigger waveforms 275, which are then forwarded to a digital trigger block in the last distributed acquisition component 217 in the chain to implement a desired digital trigger function 260 using one or more of the generated RF trigger waveforms 275. In other words, the digital trigger 260 can cause a trigger event based on criteria associated with one or more of the amplitude/power, phase, frequency, I and/or Q waveforms 275, as well as combining it with any other trigger condition in the test and measurement instrument. It will be understood that the digital trigger 260 can trigger on any kind of complex demodulated IQ component data, and the data can undergo further decoding as desired.

Thus, the real-time RF trigger span of interest can be located anywhere within the combined bandwidth of all distributed acquisition components in the interleaved system. Moreover, the RF trigger span center frequency can be located anywhere within the overall bandwidth of the interleaved system. The width of the frequency span that can be used for the RF triggering is limited by the available communication bandwidth between distributed acquisition components (i.e., the inter-component communication section 225), as the communication bandwidth imposes constraints on the maximum sample rate of the RF trigger data, which in turn limits the resulting frequency span. Preferably, the sample rate required for the desired RF trigger span bandwidth is less than, or in other words narrower than, what a single distributed acquisition component is capable of handling in terms of sample rate. If this is the case, some decimation can be performed by multiple distributed acquisition components in parallel, which reduces the sample rate required in each of the paths and in the inter-communication before recombining.

For example, an acquisition system might receive or acquire a signal at a rate of X samples per second, but the user is only interested in a portion of the signal, for example, corresponding to one eighth of the associated frequency span to complete a particular, triggering, measurement, or analysis task. The acquisition system can comprise four time-interleaved acquisition paths, in which each distributed acquisition path receives input data at a sample rate of X/4 samples/second. One eighth of the total sample rate is X/8 samples/second. So each distributed acquisition component can decimate the input data acquired at X/4 samples/second by two, which can be done simultaneously and in parallel for each distributed acquisition path, thereby resulting in filtered down-converted partial terms at a sample rate of X/8 samples/second per distributed acquisition component. The partial terms are then recombined or summed to produce the coherent waveform at X/8 samples/second.

Figure 3:
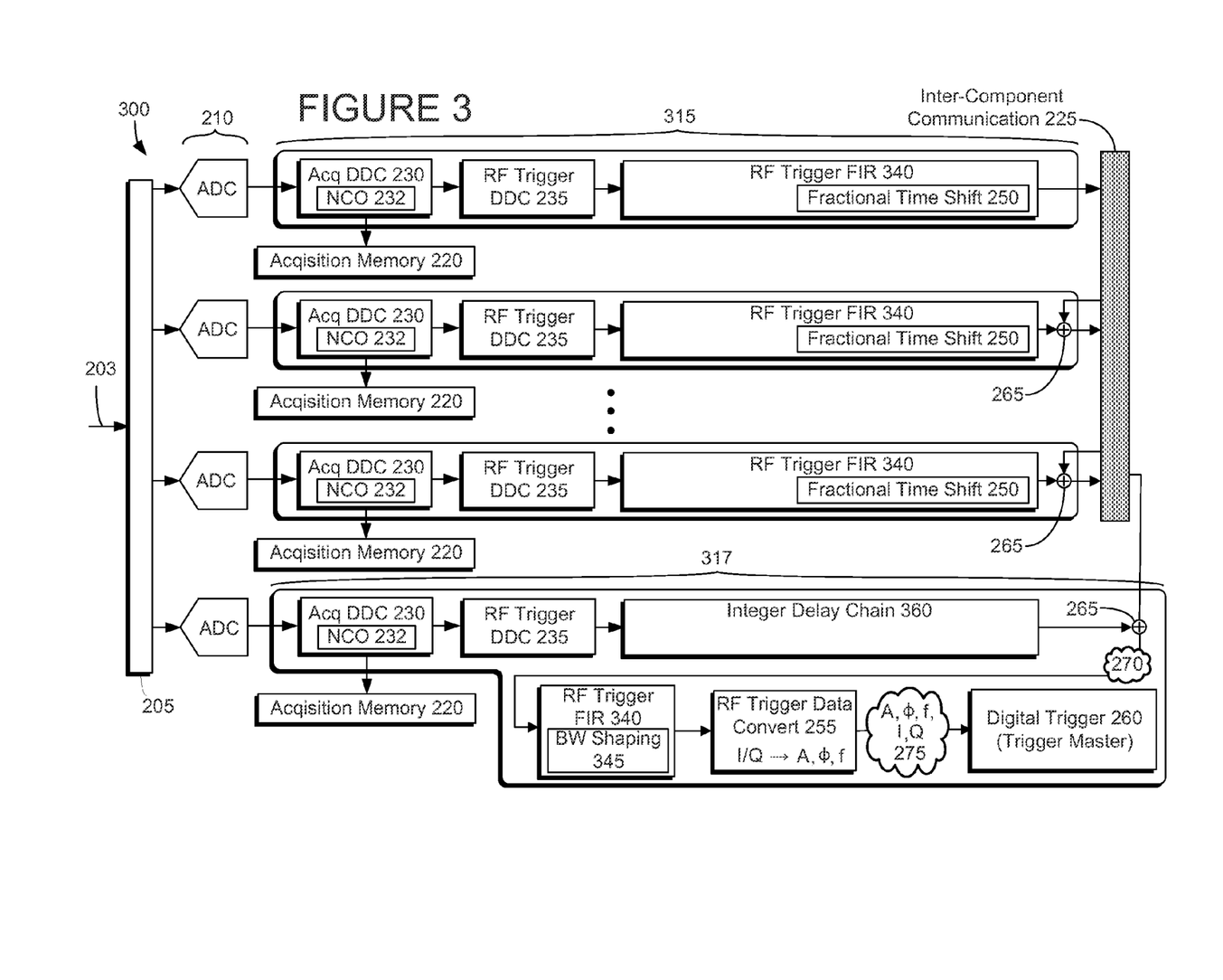
FIG. 3 illustrates a flow diagram including various components of a time-interleaved RF trigger acquisition system according to another example embodiment of the present invention.

FIG. 3 illustrates a flow diagram 300 including various components of a time-interleaved RF trigger acquisition system according to another example embodiment of the present invention. Some of the components and signals illustrated in FIG. 3 correspond to similar components and signals of FIG. 2, and for the sake of brevity, a detailed description of these components is not repeated.

The example embodiment of the acquisition system of FIG. 3 reduces the number of taps required for the RF trigger FIR filter 340. For example, the last distributed acquisition component 317 in the interleaved chain of distributed acquisition components 315 can be configured to have relative distributed acquisition component sampling phase m=0. In such a case, the time-shift FIR filter function becomes trivial in this instance, i.e., $T'_k(z)=1$. Thus, a full FIR is not required to implement this trivial time-shift function for the last distributed acquisition component 317. The other distributed acquisition component sampling phases have the necessary time-shift filter sections 250.

In lieu of the time-shift RF trigger FIR in the last distributed acquisition component 317, an integer delay chain 360 can be used to match the integer portion of the group delay in the other RF trigger FIR filters 250. In other words, the integer delay chain 360 is disposed before the summer 265 along the path of the last distributed acquisition component 317 in the interleaved chain of distributed acquisition components in place of the RF trigger FIR 340. When the samples are recombined from all of the distributed acquisition components (e.g., 315, 317), a coherent waveform 270 is the result. Since a time-shift FIR filter is not needed for time-shift filtering in the last distributed acquisition component 317, the circuit can be repurposed as a single bandwidth shaping filter section 345 using circuitry of the RF trigger FIR filter 340, which can receive and bandwidth-shape the recombined coherent waveform 270. In other words, in the last distributed acquisition component 317 in the interleave chain, the operation of the bandwidth shaping section 345 is applied to the coherent waveform 270 after reconstructing the waveform using summers 265.

Therefore, the bandwidth shaping section 345 need not be convolved with the time-shift filter response 250 in any of the distributed acquisition components 315 or the last distributed acquisition component 317 in the chain, thereby yielding fewer required taps for the RF trigger FIR filter 340, and thus a smaller circuit implementation relative to the implementation shown in FIG. 2.

Figure 4:
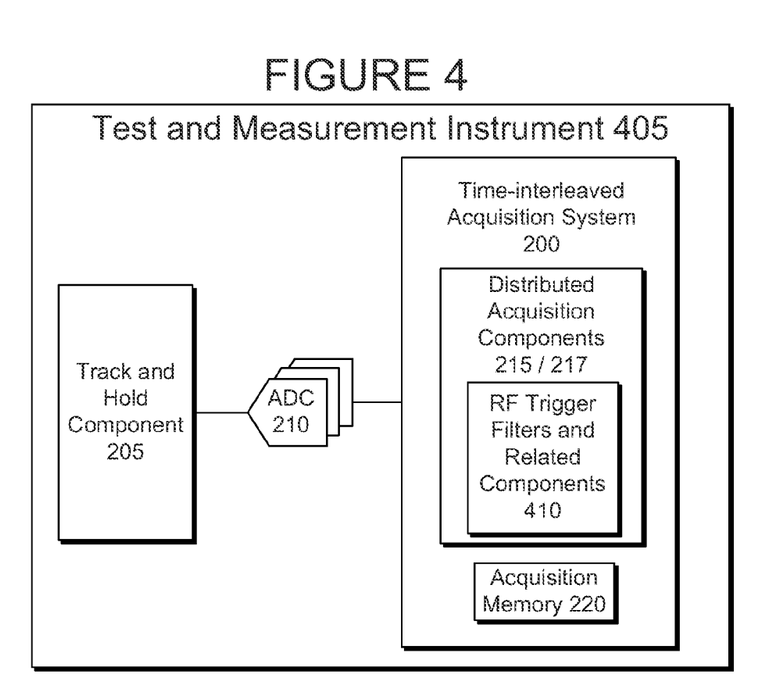
FIG. 4 illustrates a block diagram of a test and measurement instrument, including the time-interleaved RF trigger acquisition system of FIG. 2.

FIG. 4 illustrates a block diagram of a test and measurement instrument 405, including the time-interleaved RF trigger acquisition system 200 of FIG. 2. The test and measurement instrument 405 can include the track and hold component 205, the ADCs 210, and the acquisition memory 220, which are discussed in detail above. Furthermore, the time-interleaved RF trigger acquisition system 200 includes the distributed acquisition components (e.g., 215 and 217). The distributed acquisition components include RF trigger filters and related components 410, such as the acquisition DDC section 230, the RF trigger DDC section 235, and the RF trigger FIR filter 240, among other suitable components, as described in detail above with reference to FIG. 2.

Figure 5:
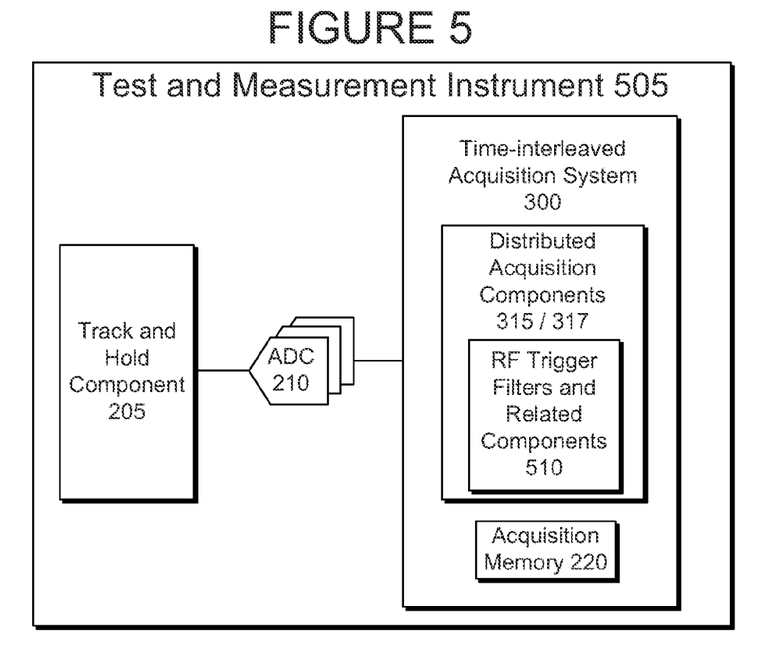
FIG. 5 illustrates a block diagram of a test and measurement instrument, including the time-interleaved RF trigger acquisition system of FIG. 3.

FIG. 5 illustrates a block diagram of a test and measurement instrument 505, including the time-interleaved RF trigger acquisition system 300 of FIG. 3. The test and measurement instrument 505 can include the track and hold component 205, the ADCs 210, and the acquisition memory 220, which are discussed in detail above. Furthermore, the time-interleaved RF trigger acquisition system 300 includes the distributed acquisition components (e.g., 315 and 317). The distributed acquisition components include RF trigger filters and related components 510, such as the acquisition DDC section 230, the RF trigger DDC section 235, and the RF trigger FIR filter 340, among other suitable components, as described in detail above with reference to FIG. 3.

Embodiments of the invention disclosed herein provide various advantages over conventional approaches. For instance, triggering on down-converted spectral waveforms is supported, including RF triggers for power, frequency, phase, and down-converted (i.e., demodulated) in-phase (I) and quadrature (Q) RF vector components, as well as triggering derived from demodulating/decoding the down-converted complex IQ data sample for a given protocol, over a frequency span of interest that can be located anywhere within the aggregate bandwidth of the interleaved acquisition system. Moreover, the communication bandwidth required for de-interleaving acquisition data samples from multiple distributed acquisition components in real-time is reduced. For example, when the RF trigger span (which can be located anywhere in the combined bandwidth of the interleaved system) is less than the total bandwidth of a single distributed acquisition component given its sample rate, the communication bandwidth is reduced and overall system efficiency is improved. This results in a system that is more feasible to implement with lower overall system cost.

In addition, system components and parts are reduced. For example, typical components for RF triggering, which can include external RF oscillator and mixer components can be eliminated. As another example, there is no requirement for a separate acquisition system to tune into the desired bandwidth for the RF trigger path. Put differently, the same acquisition system supports RF triggering on a given frequency span while allowing the acquisition system to have both greater system sample rate and wider bandwidth in storing acquisition data to memory. This enables MDO functionality to operate in very wide bandwidth applications. Higher system sample rates offer improved timing resolution relative to single-component systems. Thus, embodiments of the invention can be used to lower the cost of a wide-bandwidth/high frequency range spectral/RF acquisition system with simultaneous real-time RF triggering.

Although particular embodiments have been described, it will be appreciated that the principles of the invention are not limited to those embodiments. For example, it should be understood that while the time-interleaved RF trigger acquisition system is described herein with reference to test and measurement instruments 405 and 505, such a system can be incorporated into other kinds of test and measurement instruments, including spectrum analyzers, oscilloscopes, vector analyzers, or the like.

Some embodiments can include one or more tangible computer-readable media storing computer-executable instructions that, when executed by a processor, operate to perform the methods described herein. Variations and modifications may be made without departing from the principles of the invention as set forth in the following claims.

The invention claimed is:

1. A test and measurement instrument, comprising:
a sampler component configured to receive a signal under test;
a plurality of analog-to-digital converters (ADCs) operationally coupled to the sampler component and configured to produce digitized samples of the signal under test;
a time-interleaved acquisition system including a plurality of parallel distributed acquisition components configured in an interleaved chain, each distributed acquisition component being operationally coupled to at least one of the ADCs and configured to receive a time-interleaved portion of the digitized samples, each distributed acquisition component including:
an acquisition digital down-conversion (DDC) section having an interleaved numerically-controlled oscillator (NCO) for decimating the time-interleaved portion of the digitized samples; and
an RF trigger finite impulse response (FIR) filter configured to receive and filter the decimated samples from the acquisition DDC section; and
a last distributed acquisition component associated with the interleaved chain of distributed acquisition components configured to receive a recombined coherent waveform including the decimated and filtered samples, wherein the last distributed acquisition component includes an RF trigger data convert section that is configured to convert the decimated samples of the recombined waveform into one or more of an amplitude, phase, frequency, in-phase (I), and quadrature (Q) waveforms;
wherein each of the distributed acquisition components includes an RF trigger DDC section coupled to the acquisition DDC section, wherein the RF trigger DDC section is configured to shift the center frequency of the digitized samples.

2. The test and measurement instrument of claim 1, wherein the last distributed acquisition component associated with the interleaved chain of distributed acquisition components further includes a digital trigger configured to cause a trigger event based on criteria associated with one or more of the amplitude, phase, frequency, I, and Q waveform.

3. The test and measurement instrument of claim 1, wherein the last distributed acquisition component associated with the interleaved chain of distributed acquisition components further includes a digital trigger configured to cause a trigger event based on any trigger mode derived from demodulating or decoding down-converted complex IQ data samples.

4. The test and measurement instrument of claim 1, further comprising:
an inter-component communication section configured to exchange the decimated samples between two or more of the distributed acquisition components; and
a plurality of summers configured to sum the decimated samples so that they are reconstructed into a coherent waveform.

5. The test and measurement instrument of claim 4, wherein at least one of the distributed acquisition components includes one of the plurality of summers.

6. A test and measurement instrument, comprising:
a sampler component configured to receive a signal under tests;
a plurality of analog-to-digital converters (ADCs) operationally coupled to the sampler component and configured to produce digitized samples of the signal under test;
a time-interleaved acquisition system including a plurality of parallel distributed acquisition components configured in an interleaved chain, each distributed acquisition component being operationally coupled to at least one of the ADCs and configured to receive a time-interleaved portion of the digitized samples, each distributed acquisition component including:
an acquisition digital down-conversion (DDC) section having an interleaved numerically-controlled oscillator (NCO) for decimating the time-interleaved portion of the digitized samples; and an RF trigger finite impulse response (FIR) filter configured to receive and filter the decimated samples from the acquisition DDC section; and
a last distributed acquisition component associated with the interleaved chain of distributed acquisition components configured to receive a recombined coherent waveform including the decimated and filtered samples, wherein the last distributed acquisition component includes an RF trigger data convert section that is configured to convert the decimated samples of the recombined waveform into one or more of an amplitude, phase, frequency, in-phase (I), and quadrature (Q) waveform;
wherein each of the distributed acquisition components includes an RF trigger DDC section coupled to the acquisition DDC section, wherein the RF trigger DDC section is configured to reduce the bandwidth span and sample rate of the digitized samples.

7. A test and measurement instrument, comprising:
a sampler component configured to receive a signal under test;
a plurality of analog-to-digital converters (ADCs) operationally coupled to the sampler component and configured to produce digitized samples of the signal under test;
a time-interleaved acquisition system including a plurality of parallel distributed acquisition components configured in an interleaved chain, each distributed acquisition component being operationally coupled to at least one of the ADCs and configured to receive a time-interleaved portion of the digitized samples, each distributed acquisition component including:
an acquisition digital down-conversion (DDC) section having an interleaved numerically-controlled oscillator (NCO) for decimating the time-interleaved portion of the digitized samples; and
an RF trigger finite impulse response (FIR) filter configured to receive and filter the decimated samples from the acquisition DDC section; and
a last distributed acquisition component associated with the interleaved chain of distributed acquisition components configured to receive a recombined coherent waveform including the decimated and filtered samples, wherein the last distributed acquisition component includes an RF trigger data convert section that is configured to convert the decimated samples of the recombined waveform into one or more of an amplitude, phase, frequency, in-phase (I), and quadrature (Q) waveform;
wherein the interleaved NCO of the acquisition DDC is configured to shift a selected center frequency of the acquired signal under test to DC.

8. The test and measurement instrument of claim 7, wherein a waveform associated with the NCO in each distributed acquisition component is defined by:

$$s[n] = e^{-j\frac{2\pi f_c}{f_s}\left[n+\frac{m}{M}\right]} = \cos\left(\frac{2\pi f_c}{f_s}\left[n+\frac{m}{M}\right]\right) - j \cdot \sin\left(\frac{2\pi f_c}{f_s}\left[n+\frac{m}{M}\right]\right),$$

wherein $f_c$ is the selected center frequency of an acquisition, $f_s$ is the effective sample rate, n is the integer sample index in time for a given distributed acquisition component, m is the relative "phase" selected from 0 to M−1 of a given distributed acquisition component in a relative interleaved sample timing order, M is the total number of distributed acquisition components in the interleaved chain of distributed acquisition components, and j is the imaginary unit.

9. A test and measurement instrument, comprising:
a sampler component configured to receive a signal under test;
a plurality of analog-to-digital converters (ADCs) operationally coupled to the sampler component and configured to produce digitized samples of the signal under test;
a time-interleaved acquisition system including a plurality of parallel distributed acquisition components configured in an interleaved chain, each distributed acquisition component being operationally coupled to at least one of the ADCs and configured to receive a time-interleaved portion of the digitized samples, each distributed acquisition component including:
an acquisition digital down-conversion (DDC) section having an interleaved numerically-controlled oscillator (NCO) for decimating the time-interleaved portion of the digitized samples; and
an RF trigger finite impulse response (FIR) filter configured to receive and filter the decimated samples from the acquisition DDC section; and
a last distributed acquisition component associated with the interleaved chain of distributed acquisition components configured to receive a recombined coherent waveform including the decimated and filtered samples, wherein the last distributed acquisition component includes an RF trigger data convert section that is configured to convert the decimated samples of the recombined waveform into one or more of an amplitude, phase, frequency, in-phase (I), and quadrature (Q) waveform;
wherein each of the RF trigger FIR filters includes:
a bandwidth shaping section; and
a fractional time-shift filter convolved with the bandwidth shaping section, wherein the convolved bandwidth shaping section and time-shift filter are configured to shape and time align the decimated samples received from the acquisition DDC section relative to other interleaved acquisition components.

10. The test and measurement instrument of claim 9, wherein the fractional time-shift filter includes the following frequency response expressed as a z-transform:

$$T'_k(z) = z^{\frac{-m}{L}}$$
$$m \in [0:M-1],$$

wherein m is the relative "phase" selected from 0 to M−1 of a given distributed acquisition component in a relative interleaved sample timing order, M is the total number of distributed acquisition components in the interleaved chain of distributed acquisition components, and L is an inherent down-sample factor as a selected sample rate reduction factor for a given bandwidth span relative to the aggregate input sample rate of the interleaved acquisition system.

11. The test and measurement instrument of claim 10, wherein the inherent down-sample factor L is an aggregate combination of the total down-sampling present in the acquisition DDC section and RF trigger DDC section.

12. The test and measurement instrument of claim 9, wherein the fractional time-shift filters are configured to cancel out any aliasing caused by subsampled data in each of the interleaved acquisition components when the decimated samples are reconstructed by summation between interleaved acquisition components as the recombined coherent waveform.

13. A test and measurement instrument, comprising:
a sampler component configured to receive a signal under test;
a plurality of analog-to-digital converters (ADCs) operationally coupled to the sampler component and configured to produce digitized samples of the signal under test;
a time-interleaved acquisition system including a plurality of parallel distributed acquisition components configured in an interleaved chain, each distributed acquisition component being operationally coupled to at least one of the ADCs and configured to receive a time-interleaved portion of the digitized samples, each distributed acquisition component including:
  an acquisition digital down-conversion (DDC) section having an interleaved numerically-controlled oscillator (NCO) for decimating the time-interleaved portion of the digitized samples; and
  an RF trigger finite impulse response (FIR) filter configured to receive and filter the decimated samples from the acquisition DDC section; and
a last distributed acquisition component associated with the interleaved chain of distributed acquisition components configured to receive a recombined coherent waveform including the decimated and filtered samples, wherein the last distributed acquisition component includes an RF trigger data convert section that is configured to convert the decimated samples of the recombined waveform into one or more of an amplitude, phase, frequency, in-phase (I), and quadrature (Q) waveform;
wherein:
each of the RF trigger FIR filters of each of the plurality of parallel distributed acquisition components includes a fractional time-shift filter;
each of the RF trigger FIR filters of each of the plurality of parallel distributed acquisition components does not include a bandwidth shaping section; and
the last distributed acquisition component associated with the interleaved chain of distributed acquisition components includes an integer delay chain disposed before a last summer in lieu of an RF trigger FIR filter.

14. The test and measurement instrument of claim 13, wherein the integer delay chain is configured to match the integer portion of a group delay in the other RF trigger FIR filters.

15. The test and measurement instrument of claim 13, wherein the last distributed acquisition component associated with the interleaved chain of distributed acquisition components includes an RF trigger FIR filter repurposed as a single bandwidth shaping section, and disposed operationally after the last summer so that the recombined waveform is bandwidth-shaped by the single bandwidth shaping section.

16. The test and measurement instrument of claim 13, wherein each of the RF trigger FIR filters of the plurality of parallel distributed acquisition components is configured to tap data directly off of a corresponding one of the acquisition DDC sections based on the desired sample rate to use in an RF trigger path.

17. A method for implementing a time-interleaved RF triggering acquisition on a test and measurement instrument, the method comprising:
receiving a signal under test at a sampler component;
dividing the signal under test among a plurality of analog-to-digital converters (ADCs) operationally coupled to the sampler component;
producing digitized samples of the signal under test using the ADCs;
time-interleaving the digitized samples using an interleaved chain of parallel distributed acquisition components;
simultaneously decimating different digitized samples of the input signal under test along different paths of the interleaved chain of parallel distributed acquisition components;
simultaneously filtering the digitized samples using at least a finite impulse response (FIR) filter along different paths of the interleaved chain of parallel distributed acquisition components;
recombining the decimated and filtered samples into a coherent waveform by summation between the interleaved acquisition components; and
converting the decimated samples of the recombined coherent waveform into one or more of an amplitude, phase, frequency, in-phase (I), and quadrature (Q) waveform;
wherein each of the distributed acquisition components includes an RF trigger DDC section, the method further comprising:
the RF trigger DDC section reducing the bandwidth span and sample rate of the digitized samples.

18. The method of claim 17, further comprising:
triggering a digital trigger based on criteria associated with one or more of the amplitude, phase, frequency, I, and Q waveform.

19. The method of claim 17, further comprising:
triggering a digital trigger based on criteria associated with any trigger mode derived from demodulating or decoding down-converted complex IQ data samples.

20. The method of claim 17, further comprising:
exchanging the decimated samples between two or more of the distributed acquisition components; and
summing the decimated samples so that they are recombined as the coherent waveform.

21. A method for implementing a time-interleaved RF triggering acquisition on a test and measurement instrument, the method comprising:
receiving a signal under test at a sampler component;
dividing the signal under test among a plurality of analog-to-digital converters (ADCs) operationally coupled to the sampler component;
producing digitized samples of the signal under test using the ADCs;
time-interleaving the digitized samples using an interleaved chain of parallel distributed acquisition components;
simultaneously decimating different digitized samples of the input signal under test along different paths of the interleaved chain of parallel distributed acquisition components;
simultaneously filtering the digitized samples using at least a finite impulse response (FIR) filter along different paths of the interleaved chain of parallel distributed acquisition components;
recombining the decimated and filtered samples into a coherent waveform by summation between the interleaved acquisition components; and converting the decimated samples of the recombined coherent waveform into one or more of an amplitude, phase, frequency, in-phase (I), and quadrature (Q) waveform;

wherein each of the distributed acquisition components includes an RF trigger DDC section, the method further comprising:

the RF trigger DDC section shifting the center frequency of the digitized samples.

22. A method for implementing a time-interleaved RF triggering acquisition on a test and measurement instrument, the method comprising:

receiving a signal under test at a sampler component;

dividing the signal under test among a plurality of analog-to-digital converters (ADCs) operationally coupled to the sampler component;

producing digitized samples of the signal under test using the ADCs;

time-interleaving the digitized samples using an interleaved chain of parallel distributed acquisition components;

simultaneously decimating different digitized samples of the input signal under test along different paths of the interleaved chain of parallel distributed acquisition components;

simultaneously filtering the digitized samples using at least a finite impulse response (FIR) filter along different paths of the interleaved chain of parallel distributed acquisition components;

recombining the decimated and filtered samples into a coherent waveform by summation between the interleaved acquisition components; and converting the decimated samples of the recombined coherent waveform into one or more of an amplitude, phase, frequency, in-phase (I), and quadrature (Q) waveform;

further comprising:

shifting, using a numerically-controlled oscillator (NCO), a selected center frequency of the acquired signal under test to DC, wherein a waveform associated with the NCO in each distributed acquisition component is defined by:

$$s[n] = e^{-j\frac{2\pi f_c}{f_s}\left[n+\frac{m}{M}\right]} = \cos\left(\frac{2\pi f_c}{f_s}\left[n+\frac{m}{M}\right]\right) - j \cdot \sin\left(\frac{2\pi f_c}{f_s}\left[n+\frac{m}{M}\right]\right),$$

wherein $f_c$ is the selected center frequency of an acquisition, $f_s$ is the effective sample rate, n is the integer sample index in time for a given distributed acquisition component, m is the relative "phase" selected from 0 to M−1 of a given distributed acquisition component in a relative interleaved sample timing order, M is the total number of distributed acquisition components in the interleaved chain of distributed acquisition components, and j is the imaginary unit.

23. A method for implementing a time-interleaved RF triggering acquisition on a test and measurement instrument, the method comprising:

receiving a signal under test at a sampler component;

dividing the signal under test among a plurality of analog-to-digital converters (ADCs) operationally coupled to the sampler component;

producing digitized samples of the signal under test using the ADCs;

time-interleaving the digitized samples using an interleaved chain of parallel distributed acquisition components;

simultaneously decimating different digitized samples of the input signal under test along different paths of the interleaved chain of parallel distributed acquisition components;

simultaneously filtering the digitized samples using at least a finite impulse response (FIR) filter along different paths of the interleaved chain of parallel distributed acquisition components;

recombining the decimated and filtered samples into a coherent waveform by summation between the interleaved acquisition components; and converting the decimated samples of the recombined coherent waveform into one or more of an amplitude, phase, frequency, in-phase (I), and quadrature (Q) waveform;

further comprising:

prior to recombining the decimated samples into the coherent waveform, time aligning the decimated samples using a fractional time-shift filter, wherein the fractional time-shift filter includes the following frequency response expressed as a z-transform:

$$T'_k(z) = z^{-\frac{m}{L}}$$
$$m \in [0:M-1],$$

wherein m is the relative "phase" selected from 0 to M−1 of a given distributed acquisition component in a relative interleaved sample timing order, M is the total number of distributed acquisition components in the interleaved chain of distributed acquisition components, and L is an inherent down-sample factor as a selected sample rate reduction factor for a given bandwidth span relative to the aggregate input sample rate of an interleaved acquisition system.

24. The method of claim 23, wherein:

each of the distributed acquisition components includes an RF trigger DDC section coupled to an acquisition DDC section; and the inherent down-sample factor L is an aggregate combination of the total down-sampling present in the acquisition DDC section and the RF trigger DDC section.

25. The method of claim 23, further comprising:

cancelling out any aliasing caused by subsampled data in each of the interleaved acquisition components, using the fractional time-shift filter, when the decimated samples are recombined as the coherent waveform by summation.

* * * * *